United States Patent [19]

Antipov

[11] 3,961,999
[45] June 8, 1976

[54] METHOD FOR FORMING RECESSED DIELECTRIC ISOLATION WITH A MINIMIZED "BIRD'S BEAK" PROBLEM

[75] Inventor: Igor Antipov, Pleasant Valley, N.Y.

[73] Assignee: IBM Corporation, Armonk, N.Y.

[22] Filed: June 30, 1975

[21] Appl. No.: 592,015

[52] U.S. Cl. ............................. 148/175; 29/578; 29/580; 29/590; 148/174; 156/612; 357/49; 357/50; 357/59; 427/86
[51] Int. Cl.² ............... H01L 21/76; H01L 21/20
[58] Field of Search ............ 148/174, 175; 357/49, 357/50, 59; 29/578, 580, 590; 427/86; 156/612

[56] References Cited
UNITED STATES PATENTS

| | | | |
|---|---|---|---|
| 3,783,047 | 1/1974 | Paffen et al. | 357/50 X |
| 3,858,231 | 12/1974 | Magdo et al. | 357/49 X |
| 3,886,000 | 5/1975 | Bratter et al. | 148/175 |
| 3,900,350 | 8/1975 | Appels et al. | 148/175 |

OTHER PUBLICATIONS

"Selective Oxidation of Silicon and Its Device Applications", *Semiconductor Silicon*, 1973, edited by Huff et al., Electrochem. Soc., Publ., pp. 860–879.
Appels et al., "Local Oxidation of Silicon; New Technological Aspects", Philips Res. Repts, June, 1971, pp. 157–165.
Kooi et al., "Locos Devices", Ibid., June 1971, pp. 166–180.
Antipov, I., "Isolation of N and P Regions . . . . Structure", I.B.M. Tech. Discl. Bull., vol. 17, No. 5, Oct. 1974, pp. 1545–1546.

*Primary Examiner*—L. Dewayne Rutledge
*Assistant Examiner*—W. G. Saba
*Attorney, Agent, or Firm*—J. B. Kraft

[57] ABSTRACT

In the fabrication of integrated circuits, a method is provided for forming recessed silicon dioxide isolation in integrated circuits in which the "bird's beak" problems associated with conventional silicon dioxide-silicon nitride composite masking structures is minimized. A conventional composite mask comprising a bottom layer of silicon dioxide and an upper layer of silicon nitride having a plurality of openings defining the regions in the silicon substrate which are to be thermally oxidized is formed on a silicon substrate. Recesses are then etched in the silicon substrate in registration with the openings in the composite mask. Then, the silicon dioxide layer is, in effect, over-etched to extend the openings in the silicon dioxide to greater lateral dimensions than the openings in the silicon nitride layer whereby the silicon nitride at the periphery of the openings is undercut.

A layer of silicon is then deposited in the recesses covering the undercut portions of said silicon nitride layer. Then, the structure subjected to thermal oxidation whereby the silicon in and abutting the recesses is oxidized to form regions of recessed silicon dioxide substantially coplanar with the unrecessed portions of the silicon substrate. Because of the undercutting and the deposition of silicon in the recesses, the "bird's beak" effect is minimized.

5 Claims, 6 Drawing Figures

METHOD FOR FORMING RECESSED DIELECTRIC ISOLATION WITH A MINIMIZED "BIRD'S BEAK" PROBLEM

BACKGROUND OF THE INVENTION

In recent years, silicon nitride masks have become a sought-after expedient in the fabrication of integrated circuits. Originally, the art applied masking layers comprising silicon nitride directly onto silicon substrates. This gave rise to problems associated with high stresses created on the underlying silicon substrate by the silicon nitride-silicon interface. Such stresses were found in many cases to produce dislocations in the silicon substrate which appear to result in undersirable leakage current pipes and otherwise adversely affect the electrical characteristics of the interface. In order to minimize such interface stresses with silicon nitride layers, it has become the practice in the art to form a thin layer of silicon dioxide between the silicon substrate and the silicon nitride layer. While this approach has been relatively effective in the cases where this silicon dioxide-silicon nitride composite is utilized only for passivation, problems have arisen where these silicon dioxide-silicon nitride composites have been utilized as masks, and, particularly, when utilized as masks against thermal oxidation. During such thermal oxidation, there is a substantial additional lateral penetration of silicon oxide from the thermal oxidation beneath the silicon nitride. This lateral penetration is greatest at the mask-substrate interface to provide a laterally sloping structure known and recognized in the prior art as the undesirable "bird's beak."

The publications, "Local Oxidation of Silicon; New Technological Aspects," by J. A. Appels et al. Phillips Research Report 26, pp. 157 – 165, June 1971, and "Selective Oxidation of Silicon and Its Device Application," E. Kooi et al., *Semiconductor Silicon* 1973, published by the Electrochemical Society, Edited by H. R. Huff and R. R. Burgess, pp. 860 – 879, are representative of the recognition in the prior art of the "bird's beak" problems associated with silicon dioxide-silicon nitride composite masks.

The "bird's beak" problems are particularly significant when silicon dioxide-silicon nitride composite masks are used in the formation of recessed silicon dioxide to be used for dielectric isolation. In such recessed oxide formation techniques, the silicon dioxide-silicon nitride composite masks are first used as an etch barrier while recesses are etched through the mask openings in the silicon substrate. These recesses are subsequently subjected to the previously described thermal oxidation to form recessed silicon dioxide regions providing dielectric isolation extending into the silicon substrate from the surface. Such recessed silicon dioxide regions would be most desirably coplanar with the remainder of the silicon surface. However, as a result of the "bird's beak," a lateral junction or edge of the recessed silicon dioxide isolation region is very vaguely defined. With any recessed isolation it is highly desirable that the lateral edges of the recessed silicon dioxide be substantially vertical, i.e., perpendicular to the semiconductor substrate surface. Instead, as a result of the "bird's beak," the edges of the recessed silicon dioxide are gradually sloped with respect to the silicon surface, being at an angle which varies from 15° to 30° with respect to the surface instead of the desirable 90° angle.

Because of this gradual lateral junction in the recessed silicon dioxide, the recessed area does not clearly define abutting regions introduced by either diffusion or ion implantation, particularly shallow abutting regions. In the case of such shallow abutting regions, there is a distinct possibility that during subsequent etching steps part of the "bird's beak" at the surface will be etched away to provide an undesirable exposure of the P-N or other junction of the abutting shallow region.

However, even with deeper regions formed by diffusion, the indefiniteness of the lateral junction of the abutting recessed silicon dioxide region renders it difficult to control lateral geometries of introduced region, and therefore imposes the need for wider tolerances of lateral dimension in the integrated circuit layout.

The above mentioned lack of definition because of the "bird's beak" is particularly pronounced when the recessed silicon dioxide regions abutting the silicon region are utilized to define a region of a given conductivity type introduced into a silicon substrate region adjoining such recessed silicon dioxide regions. In such a case, one of the significant advantages of recessed oxide technology as taught in the prior art is the ability to eliminate precise mask alignment steps when introducing said conductivity-type region. In accordance with the art, it is desirable to first cover the surface of the substrate with a layer of an insulative material, particularly silicon dioxide, after which a step involving only very gross masking coupled with dip etching is utilized to avoid such mask alignment when forming openings in the silicon dioxide layer through which the conductivity-determining impurities are to be introduced into the silicon substrate. The dip etching process is continued for a time calculated to be sufficient to remove only the deposited silicon dioxide layer from the surface of selected silicon substrate region (the selection of regions is of course determined by the gross block-out mask) but insufficient to affect the surrounding recessed silicon dioxide region. However, because of the "bird's beak," the extent of such surrounding recessed oxide regions, particularly at the substrate surface, becomes indefinite and the portion of the silicon substrate exposed may vary substantially dependent on the extent of the "bird's beak," Thus, because of the variation in opening size, the introduced region may vary substantially in lateral dimension.

Because of this variation of lateral dimensions, contact openings made to such introduced regions through subsequently formed insulative layers cannot be made with any definiteness or precision because such contact opening may expose a surface junction between the introduced region and an abutting region of semiconductor material. Accordingly, an additional advantage of recessed silicon dioxide technology, i.e., that of defining contact openings to abutting regions formed in the substrate is also unrealized.

SUMMARY OF THE PRESENT INVENTION

Accordingly, it is an object of the present invention to provide a method of integrated circuit fabrication which utilizes recessed oxide regions to define regions of selected conductivity-type introduced into the substrate wherein the definition of the introduced region is substantially unaffected by "bird's beak" problems.

It is another object of the present invention to provide a method of integrated circuit fabrication utilizing recessed silicon dioxide regions to at least partially define the electrical contact openings and contacts made to abutting regions of selected conductivity-type introduced into the substrate wherein the nature of such electrical contacts are substantially unaffected by "bird's beak" problems.

It is a further object of the present invention to provide a method for integrated circuit fabrication utilizing recessed silicon dioxide dielectric isolation which is substantially free of the problems of exposed junctions between regions of different conductivity at the surface of the silicon substrate during the formation of electrical contact openings into the substrate.

In accordance with the method of the present invention, in the formation of integrated circuits, dielectrically isolated regions in a silicon substrate are formed by the steps of forming a layer of silicon dioxide on the surface of the substrate, and then forming a masking layer of silicon nitride having a plurality of openings on said silicon dioxide layer. A plurality of openings through the masked silicon dioxide layer are then etched wherein said openings are in registration with and have greater lateral dimensions than the silicon nitride mask openings. Therefore, the silicon dioxide layer openings undercut the silicon nitride at the periphery of the masked openings.

A plurality of recesses in the silicon substrate are then etched respectively in registration with the openings through the composite silicon dioxide-silicon nitride masking layers. Then, a layer of silicon is deposited in the recesses covering the undercut portions of the silicon nitride mask. At this point, the entire structure is thermally oxidized to oxidize the silicon in and abutting the recesses to form regions of recessed silicon dioxide substantially coplanar with the unrecessed portions of the silicon substrate.

It appears that the "bird's beak" effect is normally associated with the presence of silicon dioxide in the critical areas where the "beak" tends to occur during the thermal oxidation step. By eliminating the silicon dioxide from these areas by undercutting and by covering with deposited silicon, the present invention minimizes the "bird's beak" effect.

For best results, in this respect, the opening through the silicon dioxide layer should also have greater lateral dimensions than those of said recesses in the silicon substrate.

The foregoing and other objects, features and advantages of the invention will be apparent from the following more particular description of the preferred embodiments of the invention, as illustrated in the accompanying drawings.

DESCRIPTION OF THE PREFERRED EMBODIMENT

Figure 1:
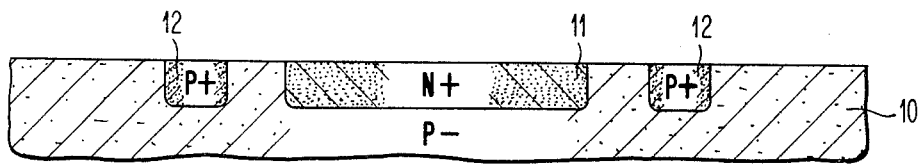
FIGS. 1 – 6 are diagrammatic sectional views of a portion of an integrated circuit in order to illustrate the method of the preferred embodiment of the present invention.

With reference to FIGS. 1 – 6, in a suitable wafer 10 of P- material, i.e., a silicon substrate having a resistivity of 10 ohm-cm, N+ region 11 is formed utilizing conventional photolithographic masking techniques involving a standard silicon oxide masking of the surface of the substrate. The region may be formed by any conventional ion implantation or thermal diffusion of impurities such as phosphorus, arsenic, antimony or the like to an N+ surface concentration of $10^{21}$ atoms/cm$^3$. By similar techniques, P+ region 12 is formed surrounding region 11. The conductivity-determining impurity in region 12 may be a material such as boron or gallium having an approximate $C_0$ of $5 \times 10^{19}$ atoms/cm$^3$. The structure at this stage is shown in FIG. 1.

In this connection, it should be noted that the structure being shown and described is only a small portion of an integrated circuit and is intended to illustrate how the masking method of the present invention is operable to fabricate recessed silicon dioxide regions which dielectrically isolate regions in a silicon substrate. Except for the method of undercutting and silicon deposition, the techniques utilized to form the recessed silicon dioxide dielectrically isolated integrated circuit are substantially described in U.S. Pat. No. 3,858,231.

Figure 2:
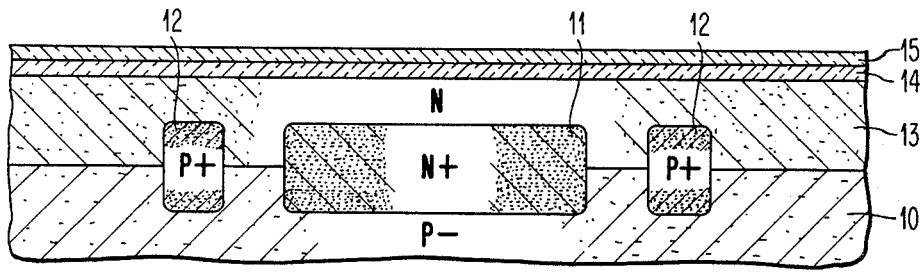

Now, with reference to FIG. 2, there is then formed on substrate 10 an N-type epitaxial layer 13 having a maximum impurity concentration or doping level of about $10^{16}$ atoms/cm$^3$ by conventional epitaxial deposition techniques having temperature in the order of 950° to 1150°C over a period of from 15 to 30 minutes. During the deposition of epitaxial layer 13, regions 11 and 12 are out-diffused partially up into this layer. The epitaxial layer has a thickness in the order of from 1 to 4 microns, depending on the overall specifications of the integrated circuits. For purposes of the present invention, the thickness of the epitaxial layer is 2 microns. The epitaxial layer may be formed using the apparatus and method described in U.S. Pat. No. 3,424,629.

A layer of silicon dioxide 14 of about 1000 A is then formed on the surface of epitaxial layer 13. Layer 14 may be formed by any conventional thermal oxidation technique or it may be deposited by conventional vapor deposition techniques.

Next, FIG. 2, a layer comprising silicon nitride 15 having a thickness of 1000 A is deposited over the entire structure shown. The silicon nitride can be formed by any conventional technique such as the chemical vapor deposition reaction of silane and amonia. This reaction is normally carried out at a temperature in the order of 1000°C. Alternatively, silicon nitride layer 15 may be deposited by conventional RF sputter deposition techniques. While layer 15 is preferably formed of silicon nitride alone, it may also have a composition which is predominantly silicon nitride together with small amounts of silicon oxide or dioxide.

Then, FIG. 3, utilizing standard photolithographic etching techniques, openings 16 are etched through silicon nitride layer 15 in a pattern corresponding to the regions of recessed silicon dioxide isolation to be subsequently formed in the substrate. One conventional technique for etching openings 16 through the silicon nitride layer involves forming by standard photoresist methods a deposited silicon dioxide mask (not shown) over silicon nitride layer 15 defining openings 16, and etching with a suitable etchant for silicon nitride such as hot phosphoric acid or hot phosphoric salt. The silicon dioxide mask (not shown) for the silicon nitride layer is then removed leaving the openings 16 shown in FIG. 3.

Figure 3:
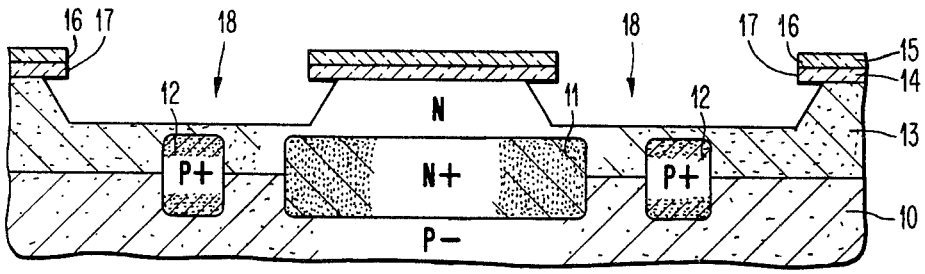

Then, FIG. 3, utilizing suitable conventional photoresist techniques, openings 17 are etched through silicon dioxide layer 14. A suitable etchant for this silicon dioxide is buffered hydrofluoric acid.

Then, as shown in FIG. 3, the composite of silicon dioxide mask 14 and silicon nitride mask 15 is utilized, and epitaxial layer 13 is partially etched away in regions 18, utilizing a conventional etchant for silicon such as a composition of nitric acid and diluted hydrofluoric acid. Openings 18 are about 0.4 – 0.5 microns in depth, resulting in the mesa-like structure shown. It should be noted that, as a result of this etching step, recesses 18 undercut the composite mask, i.e., have greater lateral dimensions than registered openings 16 and 17. For recesses in the order of 0.5 microns in depth, the lateral undercut on an opening edge will be in the order of 5000 A.

Figure 4:
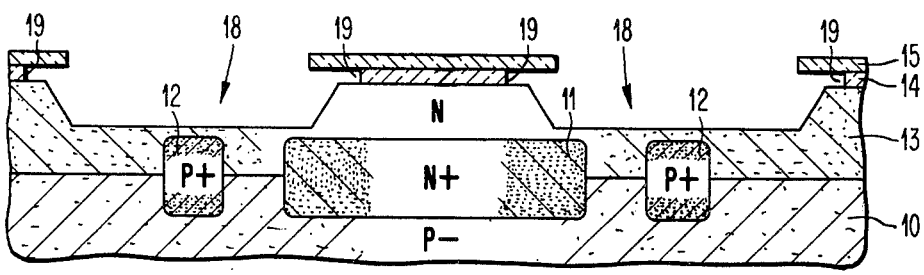

Next, FIG. 4, the structure of FIG. 3 is treated with a blanket etchant for silicon dioxide, e.g., the etchant described above, for a period sufficient to extend the lateral dimensions of openings 17 in silicon dioxide layer 14 so as to undercut silicon nitride layer 15 in regions 19. The lateral extent of the undercut in region 19 is in the order of 9000 A from the edge of openings 16.

Figure 5:
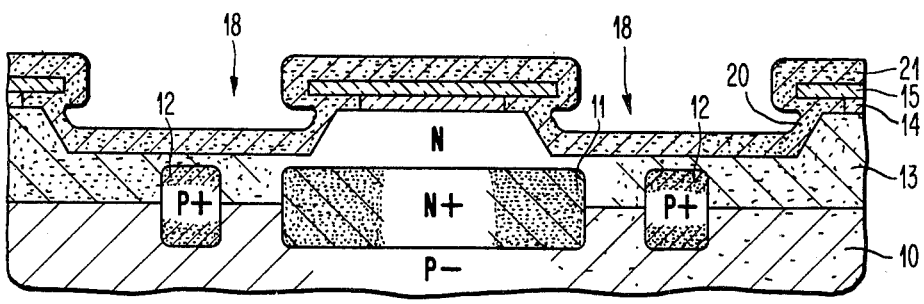

Then, FIG. 5, utilizing a conventional chemical vapor deposition technique for silicon such as that previously described with respect to the formation of the epitaxial layer, a layer of silicon in the order of from 1500 A to 2000 A in thickness is deposited over the entire structure. Portion 20 of this silicon layer deposited in recesses 18 will be monocrystalline in structure and will substantially fill in undercuts 19 while the portion 21 of the silicon layer deposited on silicon nitride layer 15 will be polycrystalline in structure. Alternatively, this silicon layer may be deposited utilizing any standard vapor deposition technique. For example, a low temperature chemical vapor deposition technique with operating temperatures in the order of 800° C may be utilized. With such a low temperature technique, portion 20 of the silicon layer deposited in the recesses will have a polycrystalline rather than a monocrystalline structure. This will have no effect since this silicon layer is to be subsequently oxidized to silicon dioxide.

Figure 6:
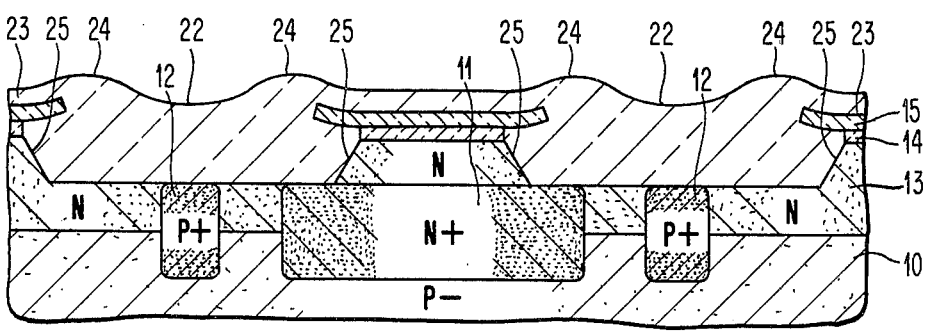

This structure is then put through an oxidation cycle where it is placed in an oxidation atmosphere in an elevated temperature, in the order of 970°– 1100° C with addition of water vapor to produce silicon dioxide recessed regions 22, FIG. 6, which are substantially coplanar with the surface of the structure. It should be noted that during this thermal oxidation process, the chemical vapor deposited silicon layer 20 in the recesses is consumed in the formation of silicon dioxide as is a portion of silicon epitaxial layer 13, thereby permitting the silicon dioxide regions 22 to extend down to P+ regions 12.

This thermal oxidation is carried out for a period sufficient so that the surface of recessed silicon dioxide regions 22 will reach about substantially the same planar level as the surface of silicon dioxide layer 23 which is being formed during this oxidation cycle from polycrystalline silicon layer 21. During this oxidation cycle, the height of recessed silicon dioxide regions 22 increases with time since epitaxial layer 13 abutting the recesses present an available source of silicon which may be consumed in increasing the height of the silicon dioxide. On the other hand, in the formation of silicon dioxide layer 23, the source of silicon provided by polycrystalline silicon layer 21 is limited since underlying silicon nitride layer 15 acts as an oxidation blocking mask preventing the oxidation of any of the underlying silicon. Thus, in order to achieve substantial planarity, the oxidation cycle is continued for a time sufficient so that the height of recessed silicon dioxide regions 22 reach the fixed height of silicon dioxide layer 23.

As will be noted from FIG. 6, the structure still retains some surface irregularities or bumps 24. These are known as "bird's heads." Such "bird's heads" are also described in detail in the hereinabove mentioned publications. These publications distinguish the "bird's head" effect from the "bird's beak" effect which the present structure has certainly minimized as will be noted from the slope of lateral edges 25 of recessed silicon dioxide regions 22 which are relatively steep, thereby solving the various edge definition problems presented by the gradually sloped "bird's beak."

While the invention has been particularly shown and described with reference to the preferred embodiments thereof, it will be understood by those skilled in the art that various changes in form and details may be made therein without departing from the spirit and scope of the invention.

What is claimed is:

1. In the fabrication of integrated circuits, a method for forming dielectrically isolated regions in a silicon substrate comprising forming a layer of silicon dioxide on a surface of the substrate, forming a masking layer of silicon nitride having a plurality of openings on said silicon dioxide layer etching a plurality of openings through the masked silicon dioxide layer in registration with and having greater lateral dimensions than the silicon nitride mask openings, whereby said silicon dioxide layer openings undercut and expose the underside of the silicon nitride layer at the periphery of said silicon dioxide layer openings etching a plurality of recesses in the silicon substrate respectively in registration with the openings through the silicon dioxide and silicon nitride layers, depositing a layer of silicon to at least partially fill said recesses and cover said exposed underside of said silicon nitride layer, and thermally oxidizing the silicon in and abutting said recesses to form regions of recessed silicon dioxide substantially coplanar with the unrecessed portions of the silicon substrate.

2. The method of claim 1 wherein the openings initially etched through said masked silicon dioxide layer have substantially the same lateral dimensions as said silicon nitride mask openings, and subsequent to the etching of said plurality of said recesses in said substrate, said silicon dioxide layer is further etched to extend the lateral dimensions of the openings in said silicon dioxide layer to undercut said silicon nitride.

3. The method of claim 2 wherein said extended openings through said silicon dioxide layer also have greater lateral dimensions than said recesses.

4. The method of claim 3 wherein said deposited layer of silicon is formed by chemical vapor deposition to partially fill said recesses.

5. The method of claim 3 wherein said silicon is blanket deposited in said recesses and over said silicon nitride mask, whereby both the silicon deposited in the recesses and on the silicon nitride mask is oxidized to silicon dioxide during said thermal oxidation.

* * * * *